US008667670B2

(12) United States Patent
Ishida

(10) Patent No.: US 8,667,670 B2
(45) Date of Patent: Mar. 11, 2014

(54) ELECTRONIC COMPONENT MOUNTING APPARATUS

(75) Inventor: Keisuke Ishida, Ibaraki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/430,277

(22) Filed: Mar. 26, 2012

(65) Prior Publication Data

US 2012/0246928 A1 Oct. 4, 2012

(30) Foreign Application Priority Data

Mar. 31, 2011 (JP) ................................ 2011-079858

(51) Int. Cl.
*B23P 19/00* (2006.01)
(52) U.S. Cl.
USPC ................... 29/740; 29/741; 29/709; 29/834
(58) Field of Classification Search
USPC ........... 29/705, 719–722, 740–743, 832–834; 414/52.1–572.7; 901/45–47
See application file for complete search history.

(56) References Cited

U.S. PATENT DOCUMENTS

| 3,931,615 | A  | * | 1/1976 | Oliver et al. ................... 712/205 |
| RE33,974  | E  | * | 6/1992 | Asai et al. ................... 29/407.04 |
| 6,543,668 | B1 | * | 4/2003 | Fujii et al. ....................... 228/103 |
| 7,003,872 | B2 | * | 2/2006 | Mimura et al. .................. 29/832 |
| 7,062,334 | B2 | * | 6/2006 | Tanaka et al. ................... 700/69 |
| 7,159,307 | B2 | * | 1/2007 | Isogai et al. .................... 29/740 |
| 7,353,589 | B2 | * | 4/2008 | Kawasumi et al. ............. 29/740 |

FOREIGN PATENT DOCUMENTS

| EP | 1486790 | * 12/2004 |
| JP | HEI 11-145688 | 5/1999 |

* cited by examiner

*Primary Examiner* — Minh Trinh
(74) *Attorney, Agent, or Firm* — Sony Corporation

(57) ABSTRACT

A mounting apparatus includes a first placing unit and a second placing unit each configured to thrust an electronic component that is held toward a substrate, place the electronic component on the substrate, and leave the substrate, and a controller configured to set an inhibit period during which, while one placing unit of the first placing unit and the second placing unit thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate.

3 Claims, 4 Drawing Sheets

ELECTRONIC COMPONENT MOUNTING APPARATUS

CROSS REFERENCES TO RELATED APPLICATIONS

The present application claims priority to Japanese Priority Patent Application JP 2011-079858 filed in the Japan Patent Office on Mar. 31, 2011, the entire content of which is hereby incorporated by reference.

BACKGROUND

The present application relates to a mounting apparatus that mounts electronic components on a substrate, and the like.

In the related art, there are a wide variety of mounting apparatuses that mount electronic components such as integrated circuit (IC) chips, resistors, or capacitors on a substrate.

As an example of such mounting apparatuses, Japanese Unexamined Patent Application Publication No. 11-145688 describes a mounting apparatus having two mounting heads. In this mounting apparatus, while a first mounting head is mounting electronic components on a substrate, a second mounting head picks up electronic components from a component feed unit. On the other hand, while the second mounting head is mounting electronic components on the substrate, the first mounting head picks up electronic components from the component feed unit. The first mounting head and the second mounting head repeat such operations alternately, thereby shorting the mounting takt time.

SUMMARY

Now, consider a case where while one of the first mounting head and the second mounting head is mounting electronic components on the substrate, the other mounting head has finished the pick-up operation of electronic components. In this case, putting the other mounting head on wait until mounting by the one mounting head finishes may lead to deterioration of the mounting takt time. Accordingly, as a way to eliminate the wait state to improve the mounting tack time, it would be possible to make the other mounting head mount electronic components on the substrate even when the one mounting head is mounting electronic components on the substrate.

However, if the two mounting heads simultaneously thrust electronic components toward the substrate or simultaneously leave the substrate, the load on the substrate increases, causing the substrate to vibrate greatly. In some cases, electronic components already mounted on the substrate move as a result, causing the positions of the electronic components on the substrate to shift. Moreover, if the timing when one mounting head thrusts electronic components toward the substrate, and the timing when the other mounting head leaves the substrate coincide, vibration of the substrate caused when the other mounting head leaves the substrate may, in some cases, damage the electronic component being held by the one mounting head.

Accordingly, it is desirable to provide a mounting apparatus having a plurality of placing units that can thrust electronic components toward the substrate or leave the substrate at appropriate timing, or the like.

A mounting apparatus according to an embodiment of the present application includes a first placing unit and a second placing unit, and a controller.

The first placing unit and the second placing unit are each configured to thrust an electronic component that is held toward a substrate, place the electronic component on the substrate, and leave the substrate.

The controller is configured to set an inhibit period during which, while one placing unit of the first placing unit and the second placing unit thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate.

In a case where, while one of the two placing units thrusts an electronic component, a thrusting operation by the other placing unit is inhibited, it is possible to prevent the two placing units from thrusting electronic components toward the substrate simultaneously. As a result, it is possible to prevent electronic components already placed on the substrate from being shifted in position due to reaction of the substrate caused when the two placing units thrust electronic components toward the substrate simultaneously. In a case where, while one of the placing units thrusts an electronic component, a substrate-leave operation by the other placing unit is inhibited, it is possible to prevent an electronic component held by the one placing unit from being damaged due to vibration of the substrate that occurs when the other placing unit leaves the substrate.

In a case where, while one of the two placing units leaves the substrate, a thrusting operation by the other placing unit is inhibited, it is possible to prevent an electronic component held by the other placing unit from being damaged due to vibration of the substrate that occurs when the one placing unit leaves the substrate. In a case where, while one of the placing units leaves the substrate, a substrate-leave operation by the other placing unit is inhibited, it is possible to prevent the two placing units from leaving the substrate simultaneously. As a result, it is possible to prevent electronic components already mounted on the substrate from being shifted in position due to reaction of the substrate caused when the two placing units leave the substrate simultaneously.

In the mounting apparatus, the inhibit period may be at least a period of a first cycle of vibration when the substrate vibrates as the one placing unit thrusts the electronic component toward the substrate.

It is considered that the vibration of the substrate that occurs when one of the placing units thrusts an electronic component onto the substrate is a damped vibration, meaning that the vibration of the first cycle is large, and the vibration becomes smaller from the second cycle onwards. Therefore, if the inhibit period is at least the period of the first cycle of vibration, positional shift of electronic components, damage to electronic components, and the like can be prevented appropriately.

In the mounting apparatus, the inhibit period may be at least a period of a first cycle of vibration when the substrate vibrates as the one placing unit leaves the substrate.

It is considered that the vibration of the substrate that occurs when one of the placing units leaves the substrate is a damped vibration, meaning that the vibration of the first cycle is large, and the vibration becomes smaller from the second cycle onwards. Therefore, if the inhibit period is at least the period of the first cycle of vibration, positional shift of electronic components, damage to electronic components, and the like can be prevented appropriately.

The mounting apparatus may further include a measuring unit that measures vibration of the substrate.

In this case, the controller may set the inhibit period in accordance with the vibration of the substrate measured by the measuring unit.

In this mounting apparatus, the inhibit period is set automatically by the controller.

An electronic component placement method according to an embodiment of the present application includes setting an inhibit period during which, while one placing unit of a first placing unit and a second placing unit, which are each configured to thrust an electronic component that is held toward a substrate, place the electronic component on the substrate, and leave the substrate, thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate, and executing the at least one of the thrusting operation and the operation of leaving the substrate by the other placing unit, after elapse of the inhibit period that has been set.

A substrate manufacturing method according to an embodiment of the present application includes setting an inhibit period during which, while one placing unit of a first placing unit and a second placing unit, which are each configured to thrust an electronic component that is held toward a substrate, place the electronic component on the substrate, and leave the substrate, thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate, and executing the at least one of the thrusting operation and the operation of leaving the substrate by the other placing unit, after elapse of the inhibit period that has been set.

As described above, according to embodiments of the present application, it is possible to provide a mounting apparatus having a plurality of placing units that can thrust electronic components toward the substrate or leave the substrate at appropriate timing, or the like.

Additional features and advantages are described herein, and will be apparent from the following Detailed Description and the figures.

DETAILED DESCRIPTION

Hereinafter, embodiments of the present application are described with reference to the drawings.

First Embodiment

Configuration of a Mounting Apparatus and Configuration of Individual Units

Figure 1:
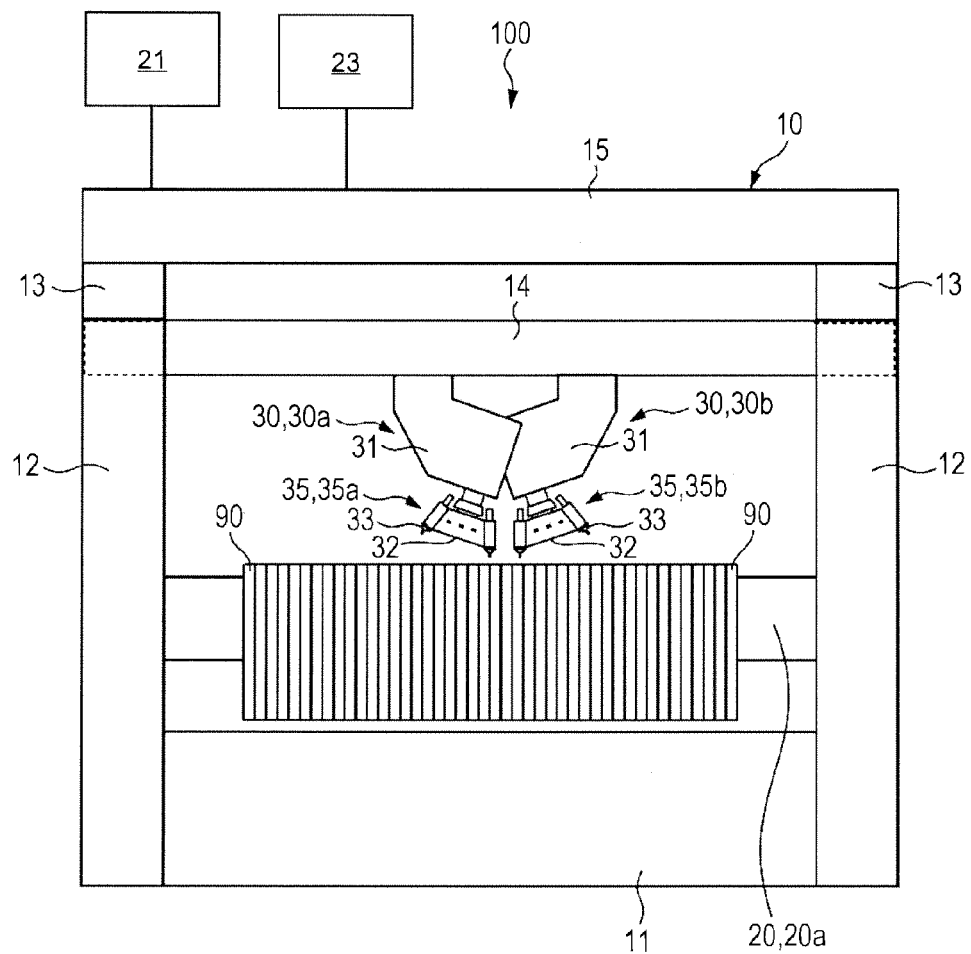
FIG. 1 is a front view illustrating a mounting apparatus according to an embodiment of the present application.
Figure 2:
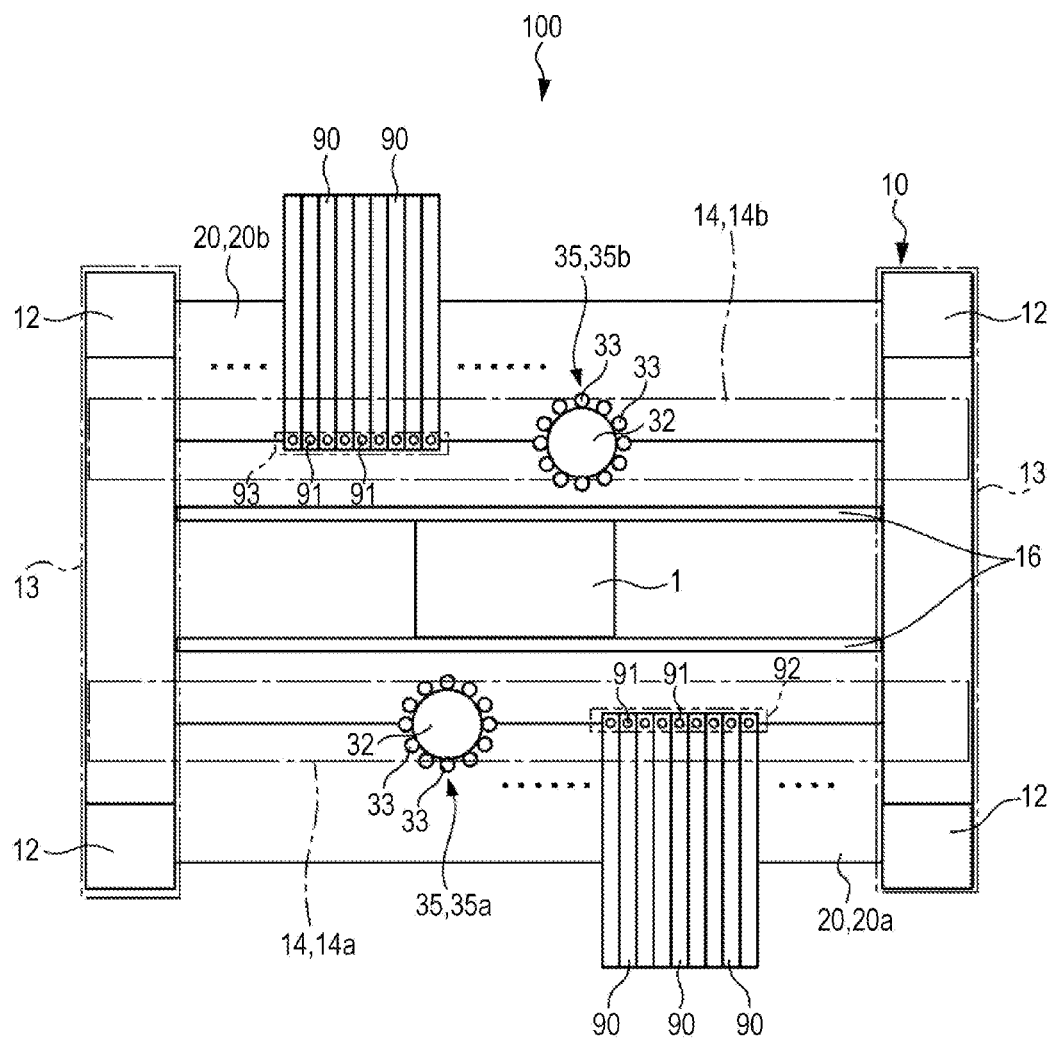
FIG. 2 is a plan view illustrating a mounting apparatus according to an embodiment of the present application.

FIG. 1 is a front view illustrating a mounting apparatus 100 according to a first embodiment of the present application. FIG. 2 is a plan view of the mounting apparatus 100 illustrated in FIG. 1.

As illustrated in FIGS. 1 and 2, the mounting apparatus 100 includes a frame structure 10, a conveyor 16 that conveys a substrate 1 along the X-axis direction, and two tape feeder-loaded units 20 each loaded with a plurality of tape feeders 90 for feeding electronic components. The mounting apparatus 100 also includes two mounting mechanisms 30 that suck electronic components fed from the tape feeders 90, and place the electronic components onto the substrate 1.

The mounting apparatus 100 has a controller 21 such as a central processing unit (CPU) that controls individual units of the mounting apparatus 100 in a centralized manner. The mounting apparatus 100 also has a non-volatile memory in which various programs necessary for control executed by the controller are stored, and a volatile memory that is used as a working area for the controller.

The frame structure 10 includes a base 11 provided at the bottom, and a plurality of columns 12 fixed to the base 11. The frame structure 10 also includes two Y-beams 13 that span along the Y-axis direction across the top of the columns 12, and two X-beams 14 that span along the X-axis between the two Y-beams 13 and can be moved in the Y-axis direction by the Y-beams 13. In addition, the frame structure 10 includes a top plate 15 provide on top of the two Y-beams 13. In FIG. 2, for ease of illustration of the drawing, the top plate 15 is omitted, and the two Y-beams 13 and the two X-beams 14 on the foreground side are indicated by alternate long and short dashed lines.

The conveyor 16 is configured to carry in the substrate 1 and position the substrate 1 in the placement position, or discharge the substrate 1 on which electronic components have been placed.

The mounting apparatus 100 has a first tape feeder-loaded unit 20a on the front side (lower side in FIG. 2), and has a second tape feeder-loaded unit 20b on the rear side (upper side in FIG. 2). The two tape feeder-loaded units 20 are so placed as to sandwich the conveyor 16. In each of the two tape feeder-loaded units 20, the tape feeders 90 are arrayed along the X-axis direction. The tape feeders 90 each include a reel around which a carrier tape accommodating electronic components is wound, and an advance mechanism that advances the carrier tape in steps. Within the carrier tape, electronic components such as IC chips, resistors, capacitors, and coils are accommodated according to kind. A feed window 91 is formed at the end of the top face of each of the tape feeders 90. An electronic component is fed via the feed window 91.

Hereinafter, the area where the feed windows 91 of the tape feeders 90 loaded on the first tape feeder-loaded unit 20a are formed in a concentrated manner is referred to as a first feed area 92. On the other hand, the area where the feed windows 91 of the tape feeders 90 loaded on the second tape feeder-loaded unit 20b are formed in a concentrated manner is referred to as a second feed area 93.

The mounting apparatus 100 includes a first mounting mechanism 30a and a second mounting mechanism 30b. The first mounting mechanism 30a can be moved in the X-axis direction by a first X-beam 14a. The second mounting mechanism 30b can be moved in the X-axis direction by a second X-beam 14b.

The first mounting mechanism 30a includes a carriage 31 that is held by the first X-beam 14a, and a first placing head 35a (first placing unit) that is provided below the carriage 31. The second mounting mechanism 30b is configured in the same manner as the first mounting mechanism 30a, except that the second mounting mechanism 30b is formed so as to be symmetrical to the first mounting mechanism 30a with respect to the Z-Y plane. That is, the second mounting mechanism 30b includes the carriage 31 that is held by the second X-beam 14b, and a second placing head 35b (second placing unit) that is provided below the carriage 31.

The first placing head 35a can be moved in the X-Y direction by the Y-beams 13 and the first X-beam 14a. The first placing head 35a can thus move between the first feed area 92 and a position above the substrate 1. The second placing head 35b can be moved in the X-Y direction by the Y-beams 13 and the second X-beam 14b. The second placing head 35b can thus move between the second feed area 93 and a position above the substrate 1.

The first placing head 35a and the second placing head 35b each have a turret 32 that is rotatably attached to the carriage 31, and a plurality of suction nozzles 33 attached to the turret 32 at equal intervals along the circumferential direction of the turret 32. In the example illustrated in FIG. 2, the number of the suction nozzles 33 on each one placing head 35 is 12. The number of the suction nozzles 33 on each placing head 35 may be one, and the number of the suction nozzles 33 is not particularly limited.

The turret 32 is rotatably supported on the carriage 31, with an obliquely orientated axis serving as the center axis of rotation. The suction nozzles 33 are rotatably supported on the turret 32. The suction nozzles 33 are attached to the turret 32 in such a way that the axis of the suction nozzles 33 is inclined with respect to the rotation axis of the turret 32. The suction nozzles 33 are supported on the turret 32 so as to be movable along the direction of the axis mentioned above. The suction nozzles 33 are driven by a nozzle driving mechanism (not illustrated) so as to rotate about their axis or move along the direction of their axis at predetermined timing. The suction nozzles 33 are connected to an air compressor (not illustrated). The suction nozzles 33 can suck or release electronic components with switching of positive and negative pressures by this air compressor.

Of the suction nozzles 33, the suction nozzle 33 located at the lowest position has its axis oriented vertically. Hereinafter, the position of the suction nozzle 33 whose axis is oriented vertically in this way is referred to operative position. The suction nozzle 33 located in the operative position is sequentially changed over by rotation of the turret 32. Of the suction nozzles 33, the suction nozzle 33 located in the operative position is moved up and down by the nozzle driving mechanism, or switched between positive and negative pressures by the air compressor.

The first placing head 35a moves to the first feed area 92, sucks target electronic components by the suction nozzles 33, moves to a position above the substrate 1, and places the electronic components sucked by the suction nozzles 33 onto the substrate 1. On the other hand, the second placing head 35b moves to the second feed area 93, sucks target electronic components by the suction nozzles 33, moves to a position above the substrate 1, and places the electronic components sucked by the suction nozzles 33 onto the substrate 1.

The mounting apparatus 100 includes a support (not illustrated) that supports the substrate 1 from below. The support is formed of, for example, a material having shock absorption property such as urethane rubber.

The mounting apparatus 100 includes a camera (not illustrated). A single such camera is provided to each of the first mounting mechanism 30a and the second mounting mechanism 30b. The camera has an imaging device such as a charge coupled device (CCD) or a complementary metal oxide semiconductor (CMOS), for example. The suction state of an electronic component by each of the suction nozzle 33 is captured by this imaging device. The camera captures the suction state of an electronic component via an optical system such as a mirror (not illustrated) provided so as to move integrally with each of the mounting mechanisms 30, for example.

The camera captures the suction state of an electronic component on each of the suction nozzles 33 when the suction nozzle 33 sucking the electronic component is moved to a predetermined position by rotation of the turret 32. For example, when the suction nozzle 33 sucking an electronic component is moved to the highest position by rotation of the turret 32, the camera captures the suction state of the electronic component. The image of the suction state taken by the camera is subjected to image processing by the controller, and the suction state is determined. When the suction state is determined, the amount of rotation of the suction nozzle 33 when placing the electronic component is corrected on the basis of the determined suction state.

[Description of Operation]

Next, operation of the mounting apparatus 100 according to this embodiment is described. The pieces of processing by the mounting apparatus 100 described below are executed under control by the controller.

"Basic Operation"

First, the basic operation of the mounting apparatus 100 is described. First, the substrate 1 is carried in by the conveyor 16, and the substrate 1 is positioned in the placement position. Next, the first placing head 35a is moved in the X-Y direction, and the first placing head 35a is moved to the first feed area 92.

Then, the suction nozzle 33 located in the operative position is moved downwards, and the suction nozzle 33 is switched to negative pressure by the air compressor. An electronic component is thus sucked onto the tip of the suction nozzle 33. Once the electronic component is sucked, the suction nozzle 33 to which the electronic component is sucked is moved upwards.

Next, the turret 32 is rotated, and the suction nozzle 33 located in the operative position is changed over. When the suction nozzle 33 located in the operative position is changed over, the corresponding suction nozzle 33 is moved downwards, and an electronic component is sucked onto the tip of the suction nozzle 33. In this way, individual electronic components are sucked onto the suction nozzles 33. When the first placing head 35a moves to the first feed area 92, electronic components are sucked onto all the suction nozzles 33 in some cases, and electronic components are sucked onto some of all the suction nozzles 33 in other cases.

The suction state of an electronic component on the suction nozzle 33 moved to an imaging position by rotation of the turret 32 is captured by the camera. The suction nozzle 33 located at the imaging position is changed over by rotation of the turret 32, and the suction state of an electronic component is captured for every one of the suction nozzles 33 on which an electronic component is sucked. The image of the suction state captured by the camera is subjected to image processing by the controller, and the suction state is determined.

When necessary electronic components are sucked onto the suction nozzles 33, the first placing head 35a is moved from the first feed area 92 to a position above the substrate 1. Then, the position of the suction nozzle 33 located in the operative position, and the position on the substrate 1 where the electronic component is to be placed are aligned. By the time when this alignment operation is finished, the suction nozzle 33 is rotated about its axis, and the orientation of the electronic component sucked on the suction nozzle 33 is adjusted. At this time, the orientation of the electronic component is corrected on the basis of information about the suction state (suction orientation) of the electronic component on the suction nozzle 33.

When the position of the suction nozzle 33 and the position of the substrate 1 are aligned, the suction nozzle 33 holding the electronic component is moved downwards (toward the substrate 1), and the electronic component is thrust toward the substrate 1 by the suction nozzle 33. Then, the suction nozzle 33 is switched from negative pressure to positive pressure by the air compressor. As a result, the electronic component is released from the suction nozzle 33, and the electronic component is placed on the substrate 1. Once the electronic component is placed on the substrate 1, the suction nozzle 33 is moved upwards, and leaves the substrate 1.

Next, the turret 32 is rotated, and the suction nozzle 33 located in the operative position is changed over. When the suction nozzle 33 located in the operative position is changed over, the corresponding suction nozzle 33 is moved downwards, and an electronic component sucked onto the tip of the suction nozzle 33 is placed on the substrate 1.

While the foregoing description is directed to the operation of sucking and placement of electronic components by the first placing head 35a, the operation of sucking and placement of electronic components by the second placing head 35b is the same as the operation by the first placing head 35a, and thus a description of this operation is omitted.

Basically, the second placing head 35b sucks electronic components in the second feed area 93 while the first placing head 35a is placing electronic components on the substrate 1. Then, the second placing head 35b places electronic components on the substrate 1 while the first placing head 35a is sucking electronic components in the first feed area 92.

Now, consider a case where, for example, while one of the first and second placing heads 35a and 35b is placing electronic components on the substrate 1, the other placing head 35 has finished the sucking operation of electronic components. For example, if the number of electronic components to be sucked by the other suction nozzle 35 is small, e.g., one or two, the other placing head 35 may, in some cases, finish the sucking operation of electronic components while the one placing head 35 is still placing electronic components.

At this time, putting the other placing head 35 on wait until the one placing head 35 finishes placement of electronic components may lead to deterioration of the mounting takt time. Accordingly, in this embodiment, even when one of the placing heads 35 is placing electronic components on the substrate 1, the other placing head 35 is configured to place electronic components on the substrate 35. That is, in this embodiment, simultaneous placement is executed by the first placing head 35a and the second placing head 35b.

Figure 3:
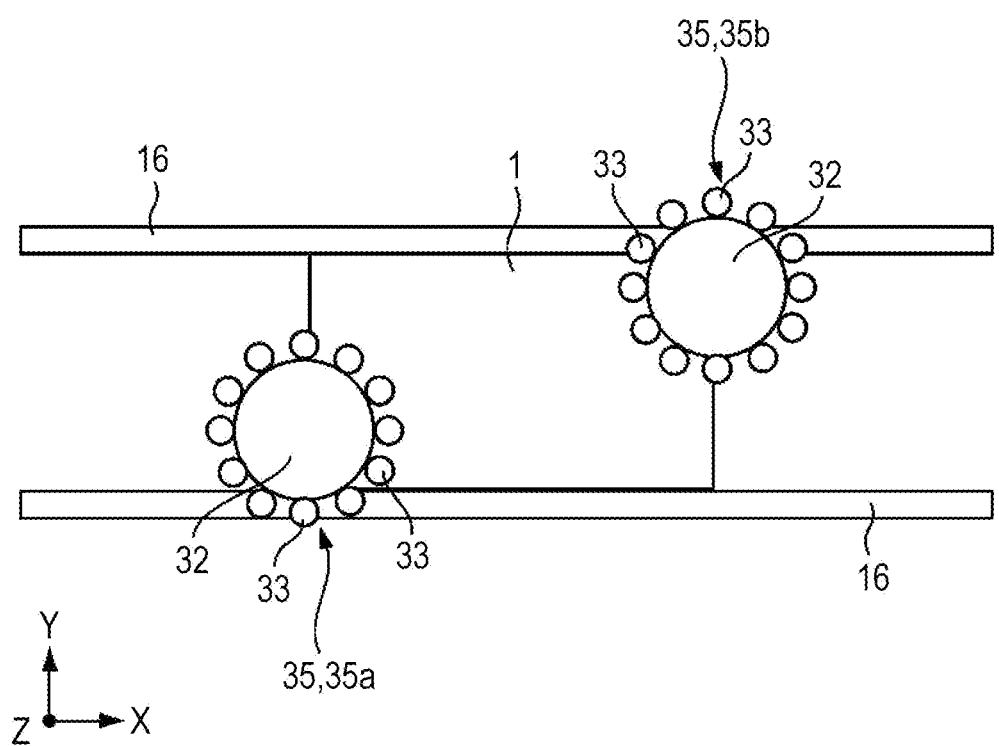
FIG. 3 illustrates the arrangement of two placing heads when simultaneous placement of electronic components is executed by the placing heads.

FIG. 3 illustrates the arrangement of the two placing heads 35 when simultaneous placement of electronic components is executed by the placing heads.

If the two placing heads 35 simultaneously thrust electronic components toward the substrate 1 or simultaneously leave the substrate 1, the load on the substrate 1 increases, causing the substrate 1 to vibrate greatly. In some cases, electronic components already placed on the substrate 1 move as a result, causing the positions of the electronic components on the substrate 1 to shift. Moreover, if the timing when one of the placing heads 35 thrusts an electronic component toward the substrate 1, and the timing when the other placing head 35 leaves the substrate 1 coincide, vibration of the substrate 1 that occurs when the other placing head 35 leaves the substrate 1 may, in some cases, damage the electronic component being held by the one placing head 35.

Accordingly, in this embodiment, the timing when the two placing heads 35 thrust electronic components toward the substrate 1 with the suction nozzles 33 and the timing when the suction nozzles 33 of the two placing heads 35 leave the substrate 1 are controlled. Hereinafter, this processing is described.

"Control of the Thrust Timing and the Substrate-Leave Timing of the Two Placing Heads 35"

Figure 4:
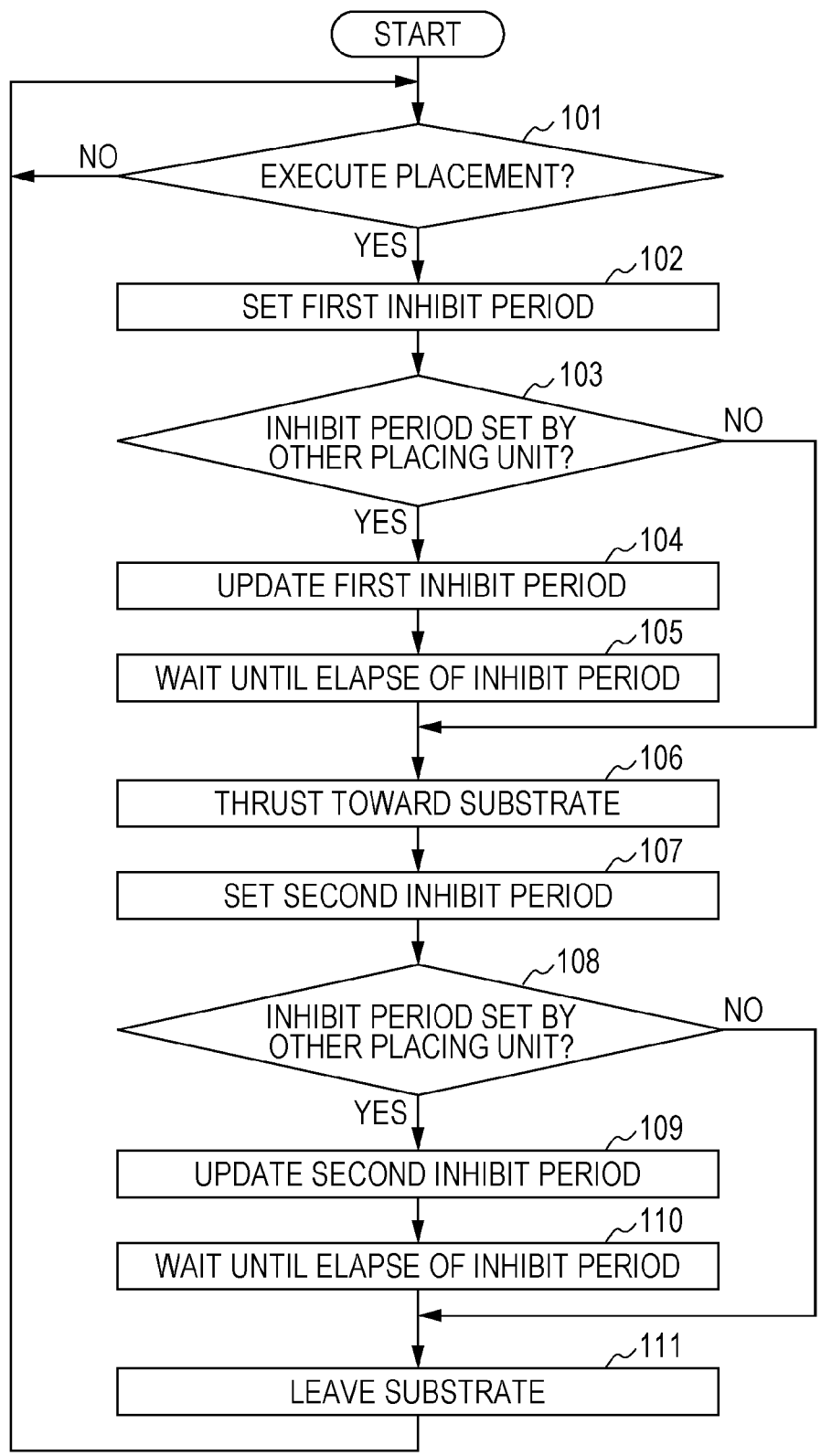
FIG. 4 illustrates how the thrust timing and substrate-leave timing of two placing heads are controlled.

FIG. 4 is a flowchart illustrating the processing at this time. The same processing is executed for the first placing head 35a and the second placing head 35b.

First, the controller determines whether or not placement of electronic components is to be executed by one of the placing heads 35 (step 101). If the determination result in step S101 is negative (step 101; NO), the controller returns to step 101, and determines again whether or not placement of electronic components is to be executed by one of the placing heads 35.

If placement of electronic components is to be executed by one of the placing heads 35 (step 101; YES), the controller sets a first inhibit period (step 102). The first inhibit period is a period during which, while one of the placing heads 35 thrusts an electronic component onto the substrate 1, the other placing head 35 is inhibited from executing an operation of thrusting an electronic component onto the substrate 1 and an operation of leaving the substrate 1.

Next, the controller determines whether or not it is currently in an inhibit period (first inhibit period or second inhibit period) that is set by the other placing head 35 (step 103). The inhibit period to be determined in step 103 is a period during which the other placing head 35 inhibits the one placing head 35 from executing a thrusting operation and a substrate-leave operation.

If it is not currently in an inhibit period set by the other placing head 35 (step 103; NO), the controller controls the one placing head 35 to move the suction nozzle 33 of the one placing head 35 downwards (step 106). As a result, an electronic component held by the suction nozzle 33 of the one placing head 35 is thrust toward the substrate 1.

If it is currently in an inhibit period set by the other placing head 35 (step 103; YES), the controller proceeds to the next step 104. In step 104, the controller updates the first inhibit period (period during which the one placing head 35 inhibits operation of the other placing head 35) set in step 102.

Upon updating the first inhibit period, the controller puts the one placing head 35 on wait until the inhibit period (period during which the other placing head 35 inhibits operation of the one placing head 35) elapses (step 105). Then, when the inhibit period elapses, the controller controls the one placing head 35 to move the suction nozzle 33 of the one placing head 35 downwards (step 106). As a result, an electronic component held by the suction nozzle 33 of the one placing head 35 is thrust toward the substrate 1.

Now, the reason why the controller updates the first inhibit period (period during which the one placing head 35 inhibits operation of the other placing head 35) in step 104 is described. As mentioned above, if the time at which the one placing head 35 attempts to thrust an electronic component onto the substrate 1 falls within the inhibit period set by the other placing head 35 (step 103; YES), the one placing head 35 is put on wait until the inhibit period elapses (step 105).

Consequently, the first inhibit period during which the one placing head 35 inhibits operation of the other placing head 35 is shifted. Accordingly, in step 104, the first inhibit period during which the one placing head 35 inhibits operation of the other placing head 35 is updated.

In updating the first inhibit period, for example, the controller may add the first inhibit period to the inhibit period during which the other placing head 35 inhibits operation of the one placing head 35.

When an electronic component is thrust onto the substrate 1 by the suction nozzle 33 of the one placing head 35, next, the controller sets a second inhibit period that inhibits operation of the other placing head 35 (step 107). The second inhibit period is a period during which while the suction nozzle 33 of the one placing head 35 leaves the substrate 1, the other placing head 35 is inhibited from executing an operation of thrusting an electronic component onto the substrate 1 and an operation of leaving the substrate 1.

The second inhibit period may be the same as or different from the first inhibit period. That is, the inhibit period that inhibits operation of the other placing head 35 while the one placing head 35 thrusts an electronic component onto the substrate 1, and the inhibit period that inhibits operation of the other placing head 35 when the one placing head 35 leaves the substrate may be the same or different.

Upon setting the second inhibit period, next, the controller determines whether or not it is currently in an inhibit period (first inhibit period or second inhibit period) during which the other placing head 35 inhibits operation of the one placing head 35 (step 108).

If it is not currently in an inhibit period set by the other placing head 35 (step 108; NO), the controller controls the one placing head 35 to move the suction nozzle 33 of the one placing head 35 upwards (step 111). As a result, the one placing head 35 leaves the substrate 1.

If it is determined in step 108 that it is currently in an inhibit period set by the other placing head 35 (step 108; YES), the controller updates the second inhibit period that is set in step 107. That is, if the time at which the one placing head 35 attempts to leave the substrate 1 falls within the inhibit period set by the other placing head 35, the one placing head 35 is put on wait during that period, which causes the second inhibit period to shift. Accordingly, the second inhibit period is updated.

Upon updating the second inhibit period, next, the controller puts the one placing head 35 on wait until the inhibit period set by the other placing head 35 elapses (step 110).

Then, when the inhibit period elapses, the controller controls the one placing head 35 to move the suction nozzle 33 of the one placing head 35 upwards (step 111). As a result, the one placing head 35 leaves the substrate 1. Next, the controller returns to step 101, and executes the processing from step 101 onwards again.

"Advantages, etc."

Through the above-mentioned processing, while one of the placing heads 35 thrusts an electronic component onto the substrate 1, the other placing head 35 is inhibited from thrusting an electronic component onto the substrate 1. Thus, it is possible to prevent the two placing heads 35 from thrusting electronic components toward the substrate 1 simultaneously. As a result, it is possible to prevent electronic components already mounted on the substrate 1 from being shifted in position due to reaction of the substrate 1 caused when the two placing heads 35 thrust electronic components toward the substrate 1 simultaneously.

Also, in this embodiment, while one of the placing heads 35 leaves the substrate 1, the other placing head 35 is inhibited from leaving the substrate 1. As a result, it is possible to prevent the two placing heads 35 from leaving the substrate 1 simultaneously. As a result, it is possible to prevent electronic components already mounted on the substrate 1 from being shifted in position due to reaction of the substrate 1 caused when the two placing heads 35 leave the substrate 1 simultaneously.

Moreover, in this embodiment, while one of the placing heads 35 thrusts an electronic component onto the substrate 1, the other placing head 35 is inhibited from leaving the substrate 1. As a result, it is possible to prevent an electronic component held by the one placing head 35 from being damaged due to vibration of the substrate 1 that occurs when the other placing head 35 leaves the substrate 1.

Furthermore, in this embodiment, while one of the placing heads 35 leaves the substrate 1, the other placing head 35 is inhibited from thrusting an electronic component onto the substrate 1. As a result, it is possible to prevent an electronic component held by the other placing head 35 from being damaged due to vibration of the substrate 1 that occurs when the one placing head 35 leaves the substrate 1.

[Details of the Inhibit Period]

Now, the inhibit period is described in detail. As mentioned above, there are two kinds of inhibit periods, the first inhibit period and the second inhibit period. The first inhibit period is a period during which, while one of the placing heads 35 thrusts an electronic component onto the substrate 1, the other placing head 35 is inhibited from executing an operation of thrusting an electronic component onto the substrate 1 and an operation of leaving the substrate 1. The second inhibit period is a period during which, while one of the placing heads 35 leaves the substrate 35, the other placing head 35 is inhibited from executing an operation of thrusting an electronic component onto the substrate 1 and an operation of leaving the substrate 1.

Making the first inhibit period and the second inhibit period too long may lead to deterioration of the mounting takt time. It is thus necessary for the first inhibit period and the second inhibit period to be set appropriately.

In this regard, once the vibration of the substrate 1 that occurs when one of the placing heads 35 thrusts an electronic component onto the substrate 1 weakens, then the first inhibit period may be cancelled to allow the other placing head 35 to thrust an electronic component onto the substrate 1 or leave the substrate 1. Likewise, once the vibration of the substrate 1 that occurs when one of the placing heads 35 leaves the substrate 1 weakens, then the second inhibit period may be cancelled to allow the other placing head 35 to thrust an electronic component onto the substrate 1 or leave the substrate 1.

It is considered that the vibration of the substrate 1 that occurs when one of the placing heads 35 thrusts an electronic component onto the substrate 1 is a damped vibration, meaning that the vibration of the first cycle is large, and the vibration becomes smaller from the second cycle onwards. Likewise, it is considered that the vibration of the substrate 1 that occurs when one of the placing heads 35 leaves the substrate 1 is a damped vibration, meaning that the vibration of the first cycle is large, and the vibration becomes smaller from the second cycle onwards. The vibration of the substrate 1 from the second cycle onwards tends to become particularly small in a case where the support that supports the substrate 1 from below when placing electronic components onto the substrate 1 is formed of a material having shock absorption property such as urethane rubber.

Accordingly, the first inhibit period is set to at least the period of the first cycle of vibration when the substrate 1 vibrates as one of the placing heads 35 thrusts an electronic component onto the substrate 1. Likewise, the second inhibit period is set to at least the period of the first cycle of vibration when the substrate 1 vibrates as one of the placing heads 35 leaves the substrate 1. By setting the inhibit period appropriately in this way, it is possible to prevent deterioration of the mounting takt time while appropriately preventing positional shift of electronic components, damage to electronic components, and the like.

By taking the above-mentioned period of the first cycle of vibration into consideration, each of the first inhibit period and the second inhibit period is set to, for example, about 0.01 to 0.05 second. This inhibit period is not limited to this range. Because the inhibit period varies with the characteristics of the substrate 1 such as the material, size, and thickness of the substrate 1, the placement speed of the placing heads 35, and so on, a suitable value is set as appropriate by taking these factors into consideration.

In order to set the first inhibit period and the second inhibit period, the mounting apparatus 100 may be provided with a measuring unit 23 that measures vibration of the substrate 1. This measuring unit measures the vibration of the substrate 1 that occurs when one of the placing heads 35 thrusts an electronic component onto the substrate 1 and/or when one of the placing heads 35 leaves the substrate 1. The measuring unit is arranged at a position on the underside of the top plate 15 corresponding to the placement position on the substrate 1, for example. As the measuring unit, a laser, optical, ultrasonic, eddy-current, or contact displacement sensor is given as an example.

In this case, the controller automatically sets the first inhibit period and the second inhibit period in accordance with the vibration of the substrate 1 measured by the measuring unit. In this case, for example, prior to executing the pieces of processing illustrated in FIG. 4, the controller may compute the first inhibit period and the second inhibit period on the basis of information about the vibration of the substrate 1 measured by the measuring unit, and set the computed first inhibit period and second inhibit period. The measurement of vibration of the substrate 1, and the computation of the inhibit periods are executed every time the kind of the substrate 1 changes, for example.

<Various Modifications>

In the foregoing description, the inhibit period (the first inhibit period or the second inhibit period) is described as being a period during which both an operation of thrusting an electronic component onto the substrate 1 and an operation of leaving the substrate 1 by the other placing head 35 are inhibited. However, the inhibit period may be a period during which one of an operation of thrusting an electronic component onto the substrate 1 and an operation of leaving the substrate 1 by the other placing head 35 is inhibited.

While the foregoing description is directed to the case where the number of mounting heads is two, the number of mounting heads may be three or four, or more.

The present application may also adopt the following configurations.

(1) A mounting apparatus including:

a first placing unit and a second placing unit each configured to thrust an electronic component that is held toward a substrate, place the electronic component on the substrate, and leave the substrate; and a controller configured to set an inhibit period during which, while one placing unit of the first placing unit and the second placing unit thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate.

(2) The mounting apparatus according to (1) mentioned above, in which the inhibit period is at least a period of a first cycle of vibration when the substrate vibrates as the one placing unit thrusts the electronic component toward the substrate.

(3) The mounting apparatus according to (1) mentioned above, in which the inhibit period is at least a period of a first cycle of vibration when the substrate vibrates as the one placing unit leaves the substrate.

(4) The mounting apparatus according to any one of (1) to (3) mentioned above, further including:

a measuring unit that measures vibration of the substrate, in which the controller sets the inhibit period in accordance with the vibration of the substrate measured by the measuring unit.

(5) An electronic component placement method including:

setting an inhibit period during which, while one placing unit of a first placing unit and a second placing unit, which are each configured to thrust an electronic component that is held toward a substrate, place the electronic component on the substrate, and leave the substrate, thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate; and executing the at least one of the thrusting operation and the operation of leaving the substrate by the other placing unit, after elapse of the inhibit period that has been set.

(6) A substrate manufacturing method including:

setting an inhibit period during which, while one placing unit of a first placing unit and a second placing unit, which are each configured to thrust an electronic component that is held toward a substrate, place the electronic component on the substrate, and leave the substrate, thrusts the electronic component or leaves the substrate, at least one of a thrusting operation of the electronic component and an operation of leaving the substrate by another placing unit is inhibited so that the other placing unit does not execute the at least one of the thrusting operation and the operation of leaving the substrate; and executing the at least one of the thrusting operation and the operation of leaving the substrate by the other placing unit, after elapse of the inhibit period that has been set.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A mounting apparatus comprising:

a first placing unit and a second placing unit each configured to thrust an electronic component that is held toward a substrate, place the electronic component on the substrate, and leave the substrate;

a controller configured to inhibit operation of one of the first placing unit or the second placing unit, wherein when one of the first placing unit or the second placing unit thrusts the electronic component on the substrate or leaves the substrate, the controller inhibits the other placing unit from at least one of thrusting the electronic component on the substrate or leaving the substrate for an inhibit period; and a measuring unit configured to measure vibrations of the substrate, wherein the controller sets the inhibit period based on the measured vibrations of the substrate.

2. The mounting apparatus according to claim 1, wherein the controller sets the inhibit period based on a period of a first cycle of vibration of the substrate when one of the first placing unit or the second placing unit thrusts the electronic component towards the substrate.

3. The mounting apparatus according to claim 1, wherein the controller sets the inhibit period based on a period of a first cycle of vibration of the substrate when one of the first placing unit or the second placing unit leaves the substrate.

* * * * *